3,170,825
Patented Feb. 23, 1965

3,170,825

DELAYING THE INTRODUCTION OF IMPURITIES WHEN VAPOR DEPOSITING AN EPITAXIAL LAYER ON A HIGHLY DOPED SUBSTRATE

Edward C. Schaarschmidt, Cranford, N.J., assignor to Merck & Co., Inc., Rahway, N.J., a corporation of New Jersey No Drawing. Filed Oct. 2, 1961, Ser. No. 141,996
1 Claim. (Cl. 148—175)

This invention relates to single crystal semiconductor bodies and more particularly to such bodies having at least one vapor deposited layer of a single crystal semiconductor material with a resistivity in the range of 1–10 ohm-cm. formed on a substrate of like conductivity having a relatively high concentration of impurities present therein.

A recent development in the transistor art has been the introduction of the epitaxial transistor. This transistor is fabricated upon a semiconductor wafer structure which includes two semiconductor layers of like conductivity type. One such layer is a substrate layer of high conductivity while the other is a layer of relatively high resistivity which is vapor deposited on the substrate layer. Of considerable importance to the performance to the epitaxial transistor is the resistivity level of the vapor-deposited layer. Specifically it is desired that this layer have a relatively high resistivity, at least in the range of 1 to 3 ohm-cm. and preferably in the range 1 to 10 ohm-cm.

Accordingly, it is an object of the present invention to provide an improved single crystal semiconductor wafer structure by growth from the vapor phase. A further object in the instant invention is to provide a single crystal semiconductor body including at least two layers of semiconductor material of like conductivity type, one of the layers being formed by growth from the vapor phase upon a high conductivity substrate, the vapor-deposited layer having a resistivity in the range of about 1 to 10 ohm-cm.

Still another object of the invention is to provide a method of making such semiconductor bodies.

These and other objects will be made apparent from the following more detailed description of the invention.

In accordance with the present invention there is provided a single crystal semiconductor body including at least two layers of single crystal semiconductor material of like conductivity type, one of these layers being a single crystal semiconductor substrate layer of high conductivity and the other being a vapor-deposited layer of relatively low conductivity.

In a preferred form of the present invention the vapor-deposited layer has a resistivity in the range of 1 to 10 ohm-cm.

In a specific embodiment of the invention, for example, a $P^+P$ single crystal semiconductor body is provided wherein the $P^+$ layer is the substrate layer and the P layer is formed by deposition from the vapor phase onto the $P^+$ layer.

As another feature of the invention there is provided a method for making such semiconductor bodies by simultaneous decomposition of a semiconductor compound and impurity atoms in the vapor phase within a reactor chamber. Specifically the method includes the steps of first providing a semiconductor substrate of predetermined conductivity type and having a relatively high concentration of impurity atoms, for example a $P^+$ semiconductor material. Thereafter a semiconductor layer of like conductivity type and having a predetermined high resistivity, for example, P semiconductor material having a resistivity in the range of 1–10 ohm-cm, is vapor deposited onto the $P^+$ substrate.

In accordance with the invention, the vapor deposited process is carried out by first depositing the semiconductor material in the absence of impurity atoms during an initial predetermined period of deposition. Then there is added a controlled amount of impurity atoms to the semiconductor atoms in the vapor phase thereby simultaneously depositing semiconductor material together with added impurity atoms to form the desired high resistivity semiconductor layer.

The foregoing process may be employed in the formation of semiconductor bodies of known semiconductor materials with the only criterion being that a decomposable vapor source of the material be available. The terms "thermally decomposable," "thermal decomposition" and the associated deposit of a product of decomposition, as used herein, are intended to be generic to the mechanisms of heat-cracking as, for example, the decomposition of silicon tetrachloride and liberation of silicon atoms through the action of heat alone and the mechanism of high temperature reactions wherein the high temperature causes interaction between various materials with liberation of specific materials or atoms as, for example, the reaction of $$3SiHCl_3 + H_2 \xrightarrow{\Delta} 2Si + SiCl_4 + 5HCl$$

used in the preferred embodiments of this invention as hereinafter indicated. For the sake of illustration, the following detailed description of apparatus used and product obtained relates to the use of the invention in the formation of single crystal semiconductor bodies.

The semiconductor bodies formed in accordance with the process of the present invention utilize the reactor apparatus and techniques described in the copending application Serial No. 129,468, filed August 4, 1961, by Allegretti and Waldman. In this application there is described a procedure for purifying trichlorosilane which is a preferred decomposable source of silicon in the present invention.

Accordingly a specific embodiment of the present invention will be described wherein a $P^+P$ semiconductor body having a resistivity in the range of 1–10 ohm-cm. is formed. Initially a plurality of $P^+$ silicon wafers having a resistivity of 0.004 ohm-cm. is provided by appropriate doping with boron and having dimensions of ¼ inch in diameter and a thickness of 5 mils. The wafers are placed on a conductive support which may be heated to a predetermined temperature thereby heating the wafers by conduction from the support. The support containing the wafers are then placed in a reactor vessel such as is described in the aforementioned copending application. Thereafter only trichlorosilane and hydrogen are admitted in the reactor at a total flow of 5.5 liters per minute. The gas stream contains 4 grams per minute of trichlorosilane. Thereupon the gases containing the heated wafers decompose on the heated wafers. Deposition is carried out for about 40 seconds to form a semiconductor layer of 1.5 microns in thickness. Thereafter boron trichloride is introduced into the gas stream in an amount of about $3.4 \times 10^{-6}$ boron trichloride atoms per cc. hydrogen and at a rate of about 140 cc. per minute Thereupon a resultant layer of semiconductor material having a resistivity of about 2.2 ohm-cm. and a thickness of about 0.8 mil is formed.

By appropriate variation in the concentration of the added doping atoms during the second phase of the deposition, vapor deposited semiconductor layers having a resistivity in the range of 1–10 ohm-cm. are produced.

While the mechanism by which the semiconductor layers having the desired resistivity are formed vary in accordance with the thickness of the present invention, it is believed that during the initial deposition there is a contribution of impurity atoms from the wafers themselves which provides the desired impurity atoms in the initially formed layer. Once a relatively high resistivity has been formed on the high conductivity layer there is relatively little contribution from the wafers themselves. Thus it is then possible to form the desired high resistivity layer on the wafers.

While the invention has been described with particular reference to certain embodiments, modifications, and additions may be made for those skilled in the art.

What is claimed is:

A method for the production of a plurality of $P^+P$ single crystal semiconductor bodies by simultaneous thermal decomposition of a thermally decomposable semiconductor compound from the vapor phase, said P layer having a resistivity in the range of about 1–10 ohm-cms., which comprises: (*a*) providing a single crystal semiconductor wafer substrate of highly doped P-conductivity type, (*b*) thermally decomposing said semiconductor compound in the substantial absence of added impurities during an initial period of deposition, (*c*) adding an amount of impurities with said semiconductor compound in the vapor phase sufficient to obtain a P layer having a resistivity in the range of about 1–10 ohm-cms., and (*d*) decomposing said combination to form said desired P layer.

References Cited in the file of this patent

UNITED STATES PATENTS

| | | |
|---|---|---|
| 2,692,839 | Christensen | Oct. 26, 1954 |
| 2,763,581 | Freedman | Sept. 18, 1956 |
| 2,857,527 | Fankove | Oct. 21, 1958 |
| 2,931,958 | Arthur | Apr. 5, 1960 |
| 3,014,820 | Marinace | Dec. 26, 1961 |
| 3,031,270 | Rummel | Apr. 24, 1962 |

FOREIGN PATENTS

| | | |
|---|---|---|
| 1,029,941 | Germany | May 14, 1958 |